(12) United States Patent
An et al.

(10) Patent No.: US 10,566,461 B2
(45) Date of Patent: Feb. 18, 2020

(54) THIN FILM TRANSISTOR AND METHOD FOR MANUFACTURING THE SAME ARRAY SUBSTRATE AND DISPLAY DEVICE

(71) Applicants: BOE Technology Group Co., Ltd., Beijing (CN); Hefei BOE Optoelectronics Technology Co., Ltd., Anhui (CN)

(72) Inventors: Hui An, Beijing (CN); Dezhi Xu, Beijing (CN); Xianxue Duan, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 40 days.

(21) Appl. No.: 15/567,060

(22) PCT Filed: Mar. 10, 2017

(86) PCT No.: PCT/CN2017/076276
§ 371 (c)(1),
(2) Date: Oct. 16, 2017

(87) PCT Pub. No.: WO2018/018893
PCT Pub. Date: Feb. 1, 2018

(65) Prior Publication Data
US 2018/0294361 A1    Oct. 11, 2018

(30) Foreign Application Priority Data
Jul. 27, 2016    (CN) .......................... 2016 1 0599762

(51) Int. Cl.
*H01L 27/14*    (2006.01)
*H01L 29/786*    (2006.01)
(Continued)

(52) U.S. Cl.
CPC ...... *H01L 29/78696* (2013.01); *G02F 1/1368* (2013.01); *G02F 1/134363* (2013.01);
(Continued)

(58) Field of Classification Search
CPC ............. H01L 27/1218; H01L 27/1222; H01L 27/1225; H01L 29/06
(Continued)

(56) References Cited

U.S. PATENT DOCUMENTS 7,316,944 B2 *   1/2008   Ahn ..................... H01L 27/1255
                                                                      257/E21.414
7,656,496 B2 *   2/2010   Kim ..................... G02F 1/13394
                                                                      349/155
(Continued)

FOREIGN PATENT DOCUMENTS

CN    103762167 A    4/2014
CN    104269414 A    1/2015
(Continued)

OTHER PUBLICATIONS

International Search Report and Written Opinion, and English Translation of International Search Report and Written Opinion from International Patent Application No. PCT/CN2017/076276, dated Jun. 9, 2017, 23 pages.
(Continued)

*Primary Examiner* — Tan N Tran
(74) *Attorney, Agent, or Firm* — Westman, Champlin & Koehler, P.A.

(57) ABSTRACT

A thin film transistor and a method for manufacturing the same, an array substrate, and a display device are provided in embodiments of the disclosure. The method for manufacturing a thin film transistor in embodiments of the disclosure forms a plurality of strip-shaped protrusions on a substrate by a patterning process before forming structures
(Continued)

of various layers of the thin film transistor, and then forms sequentially a gate electrode, a gate insulating layer, an active layer, a source-drain electrode on the plurality of strip-shaped protrusions; in other words, the thin film transistor is prepared, whose channels are aligned with and shaped to be similar to the plurality of strip-shaped protrusions, in a widthwise direction thereof.

16 Claims, 6 Drawing Sheets

(51) Int. Cl.
   *H01L 29/10* (2006.01)
   *H01L 29/06* (2006.01)
   *H01L 27/12* (2006.01)
   *H01L 29/423* (2006.01)
   *G02F 1/1343* (2006.01)
   *G02F 1/1368* (2006.01)
   *H01L 29/66* (2006.01)

(52) U.S. Cl.
   CPC ........ *H01L 27/124* (2013.01); *H01L 27/1218* (2013.01); *H01L 27/1222* (2013.01); *H01L 27/1225* (2013.01); *H01L 27/1262* (2013.01); *H01L 29/06* (2013.01); *H01L 29/10* (2013.01); *H01L 29/42384* (2013.01); *H01L 29/66765* (2013.01); *H01L 29/7869* (2013.01); *H01L 29/78603* (2013.01); *H01L 29/78669* (2013.01); *H01L 29/78678* (2013.01); *G02F 2001/134318* (2013.01); *H01L 29/66969* (2013.01)

(58) Field of Classification Search
   USPC .............................................. 257/43, 59, 72
   See application file for complete search history.

(56) References Cited

U.S. PATENT DOCUMENTS 9,786,696 B2    10/2017  Wang
2014/0209913 A1  7/2014  Song et al.

FOREIGN PATENT DOCUMENTS

CN         106024909 A       10/2016
JP         2006-245371    *  9/2006
JP         2006245371 A      9/2006

OTHER PUBLICATIONS

English Translation of Notification of Transmittal of The International Search Report and The Written Opinion of The International Searching Authority from International Patent Application No. PCT/CN2017/076276, dated Jun. 9, 2017, 3 pages.

First Office Action, including Search Report, for Chinese Patent Application No. 201610599762.7, dated Jun. 28, 2018, 17 pages.

* cited by examiner

THIN FILM TRANSISTOR AND METHOD FOR MANUFACTURING THE SAME ARRAY SUBSTRATE AND DISPLAY DEVICE

CROSS-REFERENCE TO RELATED INVENTION

The present disclosure is a Section 371 National Stage Application of International Application No. PCT/CN2017/076276, filed Mar. 10, 2017, which has not yet published, and claims the benefit of Chinese Patent Application Invention No. 201610599762.7 filed on Jul. 27, 2016 in the State Intellectual Property Office of China, the whole disclosure of which is incorporated herein by reference.

BACKGROUND OF THE INVENTION

Field of the Invention

Embodiments of the present disclosure relate to the technical field of display technology, and in particular, to a thin film transistor and a method for manufacturing the same, an array substrate, and a display device.

Description of the Related Art

Thin film Transistor is an important element of a liquid crystal display panel, and a control of a channel region thereof by a gate electrode thereof is closely related to power consumption of the thin film transistor. In order to improve the control of the channel region by the gate electrode and to decrease the power consumption thereof, then, the larger the aspect ratio of the channel in a switch of the thin film transistor type is set, the stronger a driving capability of the gate electrode is. As such, though both the aspect ratio of the channel and the control of the channel by the gate electrode may be increased, the dimensioned and orthographic projected area of the thin-film transistor may also be increased while an aperture ratio is correspondingly decreased, and in turn a display effect of may be adversely influenced.

SUMMARY OF THE INVENTION

The embodiments of the present disclosure have been made to overcome or alleviate at least one aspect of the above mentioned disadvantages and/or shortcomings in the prior art, by providing a thin film transistor and a method for manufacturing the same, an array substrate, and a display device.

Following technical solutions are adopted in exemplary embodiments of the invention for achieving the above desired technical purposes.

According to an aspect of the exemplary embodiment of the present disclosure, there is provided a method for manufacturing a thin film transistor, comprising: forming a plurality of strip-shaped protrusions on a substrate which are arranged to be spaced apart from one another in a first direction, the plurality of strip-shaped protrusions extending in a second direction; and forming a gate electrode, a gate insulating layer, an active layer and a source-drain electrode sequentially on the plurality of strip-shaped protrusions. The active layer is provided with a plurality of first strip-shaped which are aligned with the plurality of strip-shaped protrusions, and portion of the source-drain electrode which are aligned with the plurality of first strip-shaped bulges are also provided with a plurality of second strip-shaped bulges, the plurality of first strip-shaped bulges being spaced apart from one another in the first direction and extending in the second direction; and the first direction is perpendicular to the second direction which is in turn perpendicular to a longitudinal direction in which the source-drain electrode extends.

According to an exemplary embodiment of the disclosure, the forming a plurality of strip-shaped protrusions on a substrate which are arranged to be spaced apart from one another in a first direction comprises:
depositing an insulation material layer on the substrate; and
patterning on the insulation material layer, so as to form the plurality of strip-shaped protrusions which are arranged to be spaced apart from one another in the first direction.

According to an exemplary embodiment of the disclosure, the forming a plurality of strip-shaped protrusions on a substrate which are arranged to be spaced apart from one another in a first direction comprises:
depositing a transparent conductive film on the substrate; and
patterning on the transparent conductive film, so as to form a common electrode and the plurality of strip-shaped protrusions which are arranged to be spaced apart from one another in the first direction.

According to an exemplary embodiment of the disclosure, the plurality of strip-shaped protrusions are parallel to one another, and orthographic projections of the plurality of strip-shaped protrusions on a plane of the substrate fall within a scope of orthographic projections of the gate electrode on the plane of the substrate.

According to an exemplary embodiment of the disclosure, the plurality of strip-shaped protrusions are formed to be a form of an integral bump, in a lengthwise direction of a channel; or otherwise, the plurality of strip-shaped protrusions are formed to be in a form of intermittent bumps by a plurality of separated convex columns, in the lengthwise direction of a channel.

According to an exemplary embodiment of the disclosure, either one of the gate electrode, the gate insulating layer and the active layer is formed to be provided with a concave-convex structure which comprises convex portions aligned with the plurality of the strip-shaped protrusions respectively and concave portions aligned with the concave portions among the plurality of the strip-shaped protrusions respectively, the convex portions and the concave portions being arranged alternately.

According to another aspect of the exemplary embodiment of the present disclosure, there is provided a thin film transistor, comprising:
a plurality of strip-shaped protrusions which are formed on a substrate and arranged to be spaced apart from one another in a first direction, the plurality of strip-shaped protrusions extending in a second direction; and
a gate electrode, a gate insulating layer, an active layer and a source-drain electrode on the plurality of strip-shaped protrusions sequentially.

The active layer is provided with a plurality of first strip-shaped protrusions which are aligned with the plurality of strip-shaped protrusions, and portion of the source-drain electrode which are aligned with the plurality of first strip-shaped bulges are also provided with a plurality of second strip-shaped bulges, the plurality of first strip-shaped bulges being spaced apart from one another in the first direction and extending in the second direction; and
the first direction is perpendicular to the second direction which is in turn perpendicular to a longitudinal direction in which the source-drain electrode extends.

According to an exemplary embodiment of the disclosure, the plurality of strip-shaped protrusions are parallel to one another, and orthographic projections of the plurality of strip-shaped protrusions on a plane of the substrate fall within a scope of orthographic projections of the gate electrode on the plane of the substrate.

According to an exemplary embodiment of the disclosure, the plurality of strip-shaped protrusions are provided with a form of an integral bump, in a lengthwise direction of a channel; or otherwise the plurality of strip-shaped protrusions are provided with a form of intermittent bumps formed by a plurality of separated convex columns, in the lengthwise direction of a channel.

According to an exemplary embodiment of the disclosure, on each of a surface of the active layer facing the substrate and a surface of the active layer facing away from the substrate, there is provided with a concave-convex structure respectively which is aligned with the plurality of strip-shaped protrusions, the active layer being provided with a uniform thickness.

According to an exemplary embodiment of the disclosure, on each of a surface of the gate insulating layer facing the substrate and a surface of the gate insulating layer facing away from the substrate, there is provided with a concave-convex structure respectively which is aligned with the plurality of strip-shaped protrusions, the gate insulating layer being provided with a uniform thickness.

According to an exemplary embodiment of the disclosure, each of the plurality of strip-shaped protrusions is shaped to be one of a trapezoidal shape, a rectangular shape, a triangular shape, a semi-circular shape, and a semi-elliptical shape, at a cross section thereof perpendicular to a direction in which the plurality of strip-shaped protrusions extend.

According to an exemplary embodiment of the disclosure, the thin film transistor is one of an I-channel thin film transistor, a U-channel thin film transistor and an L-channel thin film transistor.

According to yet another aspect of the exemplary embodiment of the present disclosure, there is provided an array substrate, comprising the thin film transistor as above.

According to still yet another aspect of the exemplary embodiment of the present disclosure, there is provided a display device, comprising the display panel as above.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which:

FIG. 7a-7i illustrates schematic views of process of a method for preparation of an array substrate, according to an exemplary embodiment of the disclosure, to be specific:

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of the thin film transistor, the array substrate and the display device.

Figure 1:
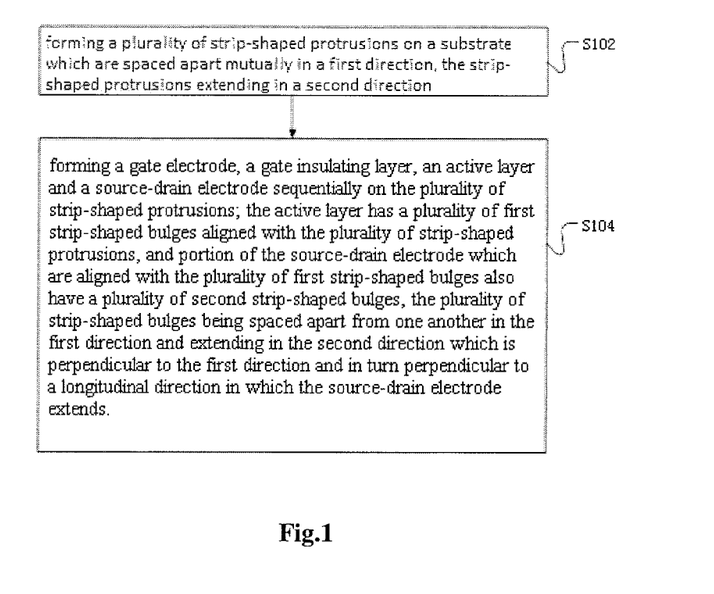
FIG. 1 illustrates a flow chart of a preparation method of a thin film transistor according to an exemplary embodiment of the disclosure.

According to a general technical concept of the present disclosure, there is provided a method for manufacturing a thin film transistor, as illustrated in FIG. 1, comprising:

Step S102: forming a plurality of strip-shaped protrusions on a substrate which are arranged to be spaced apart from one another in a first direction, the plurality of strip-shaped protrusions extending in a second direction; and Step S104: forming a gate electrode, a gate insulating layer, an active layer and a source-drain electrode sequentially, on the plurality of strip-shaped protrusions.

In above steps, the active layer is provided with a plurality of first strip-shaped bulges which are aligned with the plurality of strip-shaped protrusions, and portion of the source-drain electrode which are aligned with the plurality of first strip-shaped bulges are also provided with a plurality of second strip-shaped bulges, the plurality of strip-shaped bulges being spaced apart from one another in the first direction and extending in the second direction; and the first direction is perpendicular to the second direction which is in turn perpendicular to a longitudinal direction in which the source-drain electrode extends.

And in above step S102, by way of example, by applying a patterning process, e.g., lithography and etching, on the substrate, the plurality of strip-shaped protrusions are formed which are arranged to be spaced apart from one another in the first direction. Specifically, for example, such a step comprises: depositing a layer of insulation material on the substrate; and then patterning on the insulation material, so as to form the plurality of strip-shaped protrusions which are arranged to be spaced apart from one another in a first direction, the plurality of strip-shaped protrusions extending in the second direction. The plurality of strip-shaped protrusions thus formed is applicable to a preparation process of a thin film transistor, e.g., a TN type display device. The insulation material may for example be, but not limited to, SiNx, SiOx or SiON.

By way of example, the plurality of strip-shaped protrusions are formed to be a form of an integral bump, in the first direction. Or otherwise, by way of example, the plurality of strip-shaped protrusions are formed to be in a form of intermittent bumps by a plurality of separated convex columns, in the second direction.

In above Step S104, the step of forming a gate electrode, a gate insulating layer, an active layer and a source-drain electrode sequentially on the plurality of strip-shaped protrusions, comprises:

Above all, depositing a layer of metallic material, and forming the gate electrode which is patterned and covers the plurality of strip-shaped protrusions, by means of a patterning process. As such, orthographic projections of the plurality of strip-shaped protrusions on a plane of the substrate fall within a scope of orthographic projections of the gate electrode on the plane of the substrate. The metallic material may for example be, but not limited to, Cu, MoAlMo or Mo.

Then, depositing a layer of insulating material, and forming the gate insulating layer patterned on the gate electrode, by means of a patterning process. The insulation material for the gate insulating layer may for example be, but not limited to, SiNx, SiOx or SiON.

Next, further depositing a layer of semiconductor material, and forming the active layer patterned on the gate insulating layer, by means of a pattering process. The semiconductor material may for example be, but not limited to, a-Si, IGZO or p-Si.

Finally, forming a source-drain electrode at both ends, in the second direction, of a surface of the active layer which surface is facing away from the gate insulating layer, and forming channels of the thin film transistor at portions of the active layer by a plurality of first strip-shaped bulges formed on the active layer which first strip-shaped bulges are aligned with the plurality of strip-shaped protrusions, and portion of the source-drain electrode which are aligned with the plurality of first strip-shaped bulges being also provided with a plurality of second strip-shaped bulges. A lengthwise direction of the channels refers to a direction in which the plurality of protrusions extend, i.e., the second direction; and a widthwise direction thereof refers to a direction which is perpendicular to the lengthwise direction of the channels and parallel to the plane of the substrate, i.e., the first direction.

As to the thin film transistor which is prepared by above method for preparation, the channels of the thin film transistor may not be of a planar construction, in the widthwise direction; but instead, may be provided with a concave-convex structure aligned with the plurality of strip-shaped protrusions, so as to increase a width of the channels of the thin film transistor as compared with a conventional thin film transistor, in case that an area of overall orthographic projection of the thin film transistor on the plane of the substrate remains unchanged, so as to enhance the aspect ratio of the thin film transistor effectively, and to increase an on-current thereof but in turn to decrease overall power consumption thereof. And provided that the thin film transistor has an aspect ratio which is maintained equal to that of a conventional thin film transistor, an effective width of the channels of the thin film transistor as in the embodiments of the disclosure increases, so as to decrease a length of the channels and thus to decrease the area of overall orthographic projection of the thin film transistor on the plane of the substrate, and in turn to increase the aperture ratio of the display device.

It may be seen that, the method for manufacturing the thin film transistor in the embodiments of the disclosure forms a plurality of strip-shaped protrusions on a substrate by a patterning process before forming structures of various layers of the thin film transistor, and then forms sequentially the gate electrode, the gate insulating layer, the active layer, and the source-drain electrode on the plurality of strip-shaped protrusions by the patterning process; in other words, the thin film transistor is prepared, whose channels are aligned with and shaped similarly to the plurality of strip-shaped protrusions, in a widthwise direction thereof. By such a method, no additional process is required to handle the gate electrode, the gate insulating layer, and the active layer dedicatedly, resulting in simple processes thereof and a low cost.

And it may also be seen that, the gate electrode is formed to cover the plurality of strip-shaped protrusions; to be specific, the gate electrode is formed to be provided with a concave-convex structure which comprises convex portions aligned with the plurality of the strip-shaped protrusions respectively and concave portions aligned with the concave portions among the plurality of the strip-shaped protrusions respectively, the convex portions and the concave portions being arranged alternately. And the gate insulating layer is formed on the gate electrode; to be specific, the gate insulating layer is also formed to be provided with a concave-convex structure which comprises convex portions aligned with the plurality of the strip-shaped protrusions respectively and concave portions aligned with the concave portions among the plurality of the strip-shaped protrusions respectively, the convex portions and the concave portions being arranged alternately, such that the gate insulating layer is provided with a uniform thickness and thus is helpful in keeping a control capability of switching the channels by the gate electrode. Similarly, the active layer formed on the gate insulating layer may also be formed to be provided with a concave-convex structure which comprises convex portions aligned with the plurality of the strip-shaped protrusions respectively and concave portions aligned with the concave portions among the plurality of the strip-shaped protrusions respectively, the convex portions and the concave portions being arranged alternately, such that the active layer is provided with a uniform thickness so as to be beneficial to increase the on current and to improve homogeneity of current.

According to another aspect of the method for manufacturing a thin film transistor of the embodiments of the disclosure, above step S102 may also be implemented by following steps, i.e., depositing a layer of transparent conductive film on the substrate; and patterning on the transparent conductive film, so as to form a patterned electrode and the plurality of strip-shaped protrusions which are arranged to be spaced apart from one another in a first direction.

In above method, the patterned electrode functions as a common electrode of an ADS type display device. Thus it may be seen that, when a thin film transistor in an ADS type display device is prepared by the method of the embodiments of the disclosure, a plurality of strip-shaped protrusions may be formed simultaneously when the common electrode is formed, by just one depositing and patterning process. As such, the thin film transistor may be prepared whose channels are essentially aligned with and shaped similar to the plurality of strip-shaped protrusions, without any additional process for the plurality of strip-shaped protrusions, and without addition of processes of the patterning, so as to further simplify the processes and to decrease cost. Above patterning process adopts processes such as lithography and etching and the like; and the transparent conductive thin film may be formed by ITO and the like.

Figure 2:
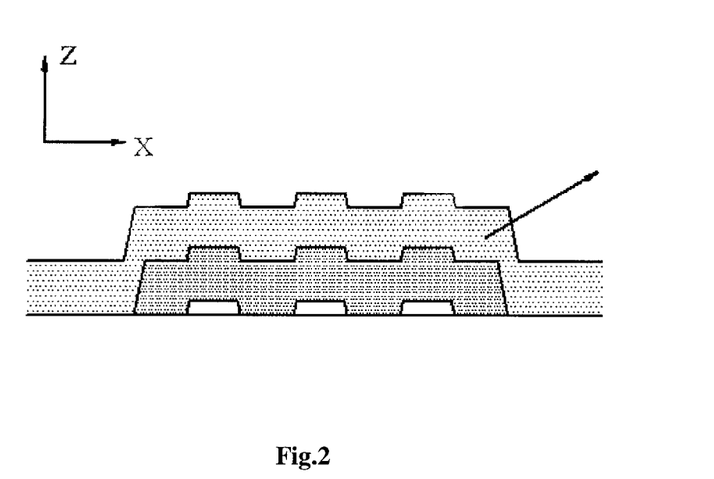
FIG. 2 illustrates a structural schematic view at a cross section of a thin film transistor according to an exemplary embodiment of the disclosure.

A thin film transistor is provided in another embodiment of this disclosure, as illustrated in FIG. 2, comprising:

a plurality of strip-shaped protrusions 02 which are formed on a substrate and arranged to be spaced apart from one another in a first direction, i.e., the x axis direction as illustrated in FIG. 2, the plurality of strip-shaped protrusions extending in a second direction, i.e, a direction which is orthogonal to both directions of the x-axis and the z-axis as illustrated in FIG. 2 and thus is referred to as a y-axis direction; and a gate electrode 03, a gate insulating layer 04, an active layer 05 and a source-drain electrode 06, 07, on the plurality of strip-shaped protrusions 02 sequentially.

And the active layer 05 is provided with a plurality of first strip-shaped bulges which are aligned with the plurality of strip-shaped protrusions, and portion of the source-drain electrode 06, 07 which are aligned with the plurality of first strip-shaped bulges are also provided with a plurality of second strip-shaped bulges, the plurality of first strip-shaped bulges being spaced apart from one another in the first direction and extending in the second direction; and the first direction is perpendicular to the second direction which is in turn perpendicular to the longitudinal direction in which the source-drain electrode extends.

In this embodiment, the source and the drain of the thin film transistor may be interchangeable; i.e., in an alternative embodiment, e.g., the reference numeral 06 refers to a drain while the reference numeral 07 refers to the source, alternatively.

Figures 3, 4A:
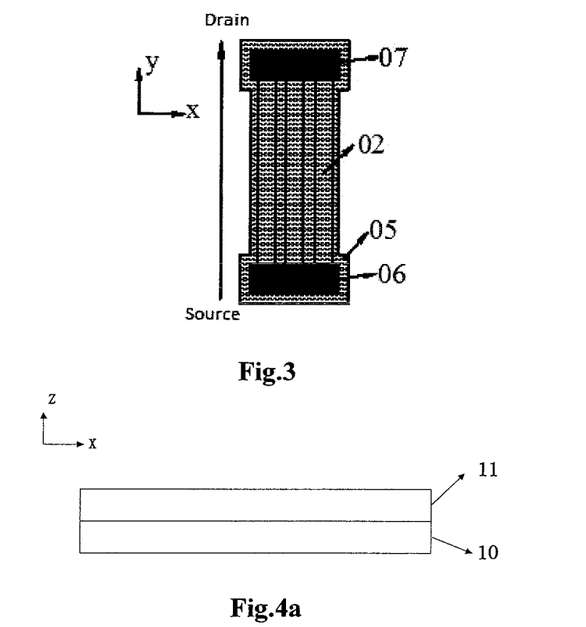
FIG. 3 illustrates a top view of a thin film transistor provided with an I-type channel, according to an exemplary embodiment of the disclosure.
FIG. 4a illustrates a structural schematic view of a channel construction of a conventional thin film transistor.

In this embodiment of the disclosure, as illustrated in FIG. 3, the plurality of strip-shaped protrusions 02 are parallel to one another one the substrate, and the source 06 and the drain 07 are located on a surface of the active layer 05 facing away from the gate insulating layer 04, at two ends thereof in a direction in which the plurality of strip-shaped protrusions 02 extend. A lengthwise direction of the channels refers to a direction in which the plurality of strip-shaped protrusions 02 extend, i.e., the second direction, also referred to as the y-axis direction as illustrated in FIG. 3; and a widthwise direction thereof refers to a direction which is perpendicular to the lengthwise direction of the channels and parallel to the plane of the substrate, i.e., the first direction, also referred to as the x-axis direction as illustrated in FIG. 3. By way of example, the plurality of strip-shaped protrusions may be provided with a form of an integral bump, in a lengthwise direction of a channel. Or otherwise, by way of example, the plurality of strip-shaped protrusions may be provided with a form of intermittent bumps formed by a plurality of separated convex columns, in the lengthwise direction of a channel. Orthographic projections of the plurality of strip-shaped protrusions 02 on a plane of the substrate fall within a scope of orthographic projections of the gate electrode 03 on the plane of the substrate. Each of the plurality of strip-shaped protrusions 02 is shaped to be a trapezoidal shape, a rectangular shape, a triangular shape, a semi-circular shape, or a semi-elliptical shape, etc., at a cross section thereof perpendicular to a direction in which the plurality of strip-shaped protrusions extend.

Figure 4B:
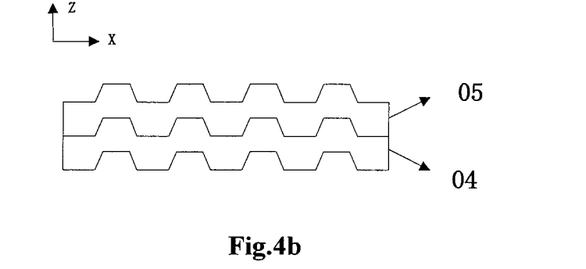
FIG. 4b illustrates a structural schematic view of a channel construction of a thin film transistor according to an exemplary embodiment of the disclosure.

FIG. 4a illustrates a structural schematic view of a channel construction of a conventional thin film transistor; and FIG. 4b illustrates a structural schematic view of a channel construction of a thin film transistor according to an exemplary embodiment of the disclosure. As illustrated in FIG. 4a, a gate insulating layer 10 and an active layer 11 of a conventional thin film transistor are of planar constructions, with a channel thereof being of a planar shape in a widthwise direction, i.e., in an x-axis direction as illustrated in FIG. 4a; however, in contrast, as illustrated in FIG. 4b, the channels of the thin film transistor in an embodiment of the disclosure may not be of a planar construction, in the widthwise direction, i.e., in the x-axis direction as illustrated in FIG. 4b; but instead, may be provided with a concave-convex structure aligned with the plurality of strip-shaped protrusions. Therefore, in the embodiment of the disclosure, a width of the channels of the thin film transistor may be increased, in case that an area of overall orthographic projection of the thin film transistor on the plane of the substrate remains unchanged, so as to enhance the aspect ratio of the thin film transistor effectively, and to increase an on-current thereof but in turn to decrease overall power consumption thereof. And provided that the thin film transistor has an aspect ratio which is maintained equal to that of a conventional thin film transistor, an effective width of the channels of the thin film transistor as in the embodiments of the disclosure increases, so as to decrease a length of the channels and thus to decrease the area of overall orthographic projection of the thin film transistor on the plane of the substrate, and in turn to increase the aperture ratio of the display device.

Furthermore, in the thin film layer of the embodiment of the disclosure, on each of a surface of the gate insulating layer facing the substrate and a surface of the gate insulating layer facing away from the substrate, there is provided with a concave-convex structure respectively which is aligned with the plurality of strip-shaped protrusions, the gate insulating layer being provided with a uniform thickness, so as to be helpful in keeping a control capability of switching the channels by the gate electrode. Similarly, on each of a surface of the active layer facing the substrate and a surface of the active layer facing away from the substrate, there is also provided with a concave-convex structure respectively which is aligned with the plurality of strip-shaped protrusions, the active layer being provided with a uniform thickness, so as to be beneficial to increase the on current and to improve homogeneity of current.

Figure 5:
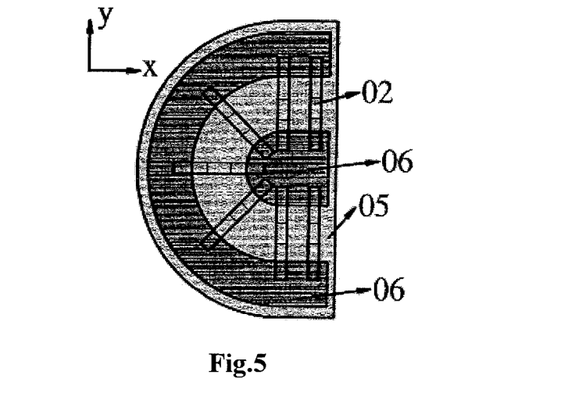
FIG. 5 illustrates a top view of a thin film transistor provided with a U-type channel, according to an exemplary embodiment of the disclosure.
Figure 6:
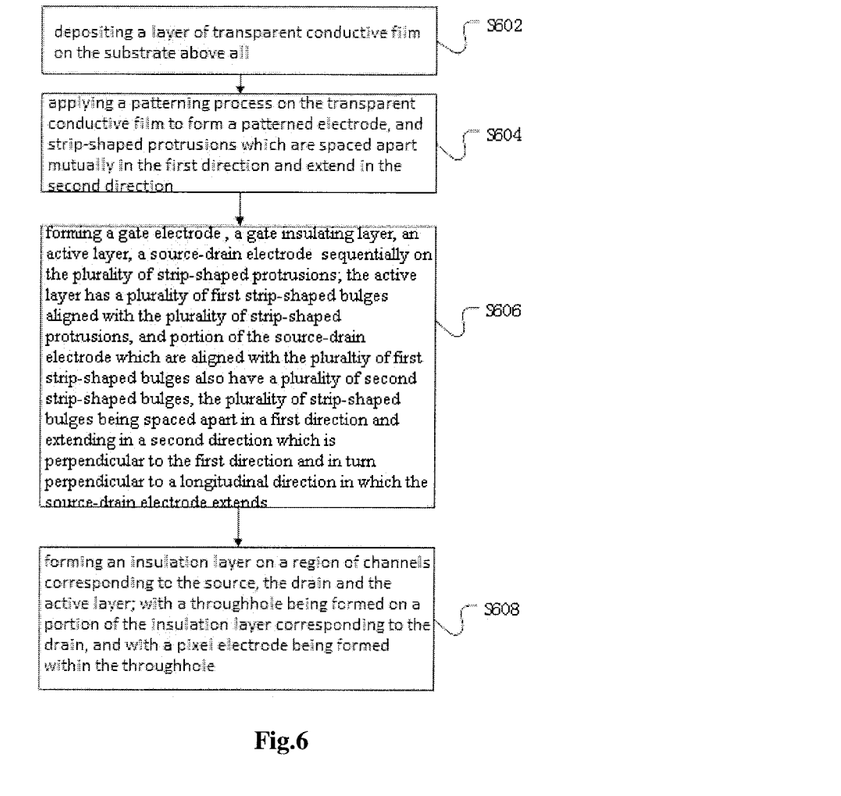
FIG. 6 illustrates a flow chart of a method for preparation of an array substrate, according to an exemplary embodiment of the disclosure.

Therefore, it may be perceptible that, above method for manufacturing a thin film transistor and the thin film transistor are both related to an I-channel thin film transistor; however, the embodiment of the disclosure is not limited thereto, since the method and the thin film transistor may also be applicable to a thin film transistor having channel of other shapes, e.g., an L-channel thin film transistor, a U-channel thin film transistor and the like. As illustrated in FIG. 5, as to the U-channel thin film transistor, the strip-shaped protrusions 02 are not parallel to one another on the substrate, but are spaced apart from one another angularly, and arranged to be in a form of an integral/overall sectorial-shaped arrangement. A portion of the active layer 05 between the source 06 and the drain 07 may be formed to be a U-shaped channel, a lengthwise direction of which is defined as a direction in which the plurality of strip-shaped protrusions extend, so as to extend over the U-shaped channel in the lengthwise direction orthogonal to; and a widthwise direction of which is defined to be a direction along a U-shaped line of the U-shaped channel, the U-shaped line being perpendicular to the lengthwise direction of the channel and parallel to the plane of the substrate. By way of example, in the embodiment of the disclosure, the U-shaped channel is also shaped in the widthwise direction to be similarly to the plurality of the strip-shaped protrusions 02, so as to increase an effective width of the channel.

In yet another embodiment of the disclosure, a method for manufacturing an array substrate is also provided, and its specific steps may be set forth in detail in view of FIGS. 6, and 7a-7i.

Figure 7A:
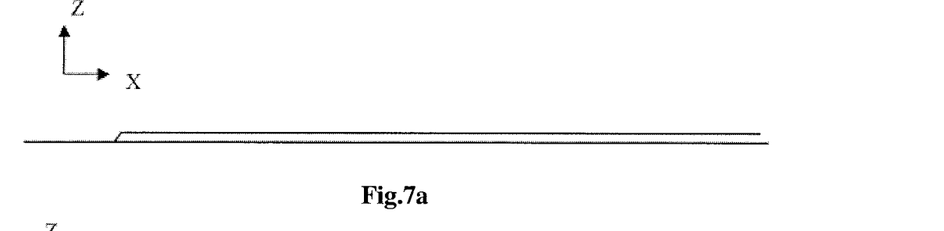
FIG. 7a illustrates a schematic front view of a construction in which a transparent conductive film is deposited on a substrate.

Step S602: depositing a layer of transparent conductive film on the substrate above all, the transparent conductive film may be formed by ITO and the like, as illustrated in FIG. 7A.

Figure 7B:
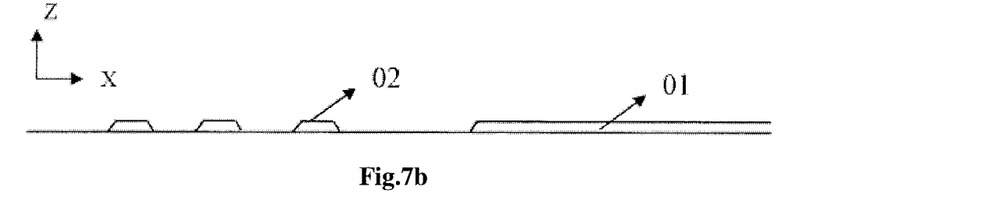
FIG. 7b illustrates a schematic front view of a construction in which a patterned electrode and strip-shaped protrusions are formed.

Step S604: patterning on the transparent conductive film so as to form a patterned electrode 01 and a plurality of strip-shaped protrusions 02 which are arranged to be spaced apart from one another in the first direction. The plurality of strip-shaped protrusions 02 may extend in the second direction, and the patterned electrode 01 may function as a common electrode of an ADS-type display device. Above patterning process adopts processes such as lithography and etching and the like; and the transparent conductive thin film may be formed by ITO and the like, as illustrated in FIG. 7b.

Step S606: forming a gate electrode 03, a gate insulating layer 04, an active layer 05 and a source-drain electrode 06, 07 sequentially, on the plurality of strip-shaped protrusions 02, as illustrated in FIGS. 7c, 7d, 7e, 7f, 7g, and 7h. The active layer 05 is provided with a plurality of first strip-shaped bulges which are aligned with the plurality of strip-shaped protrusions, and portion of the source-drain electrode 06, 07 which are aligned with the plurality of first strip-shaped bulges are also provided with a plurality of second strip-shaped bulges, the plurality of strip-shaped bulges being spaced apart from one another in a first direction and extending in a second direction. And the first direction is perpendicular to the second direction which is in turn perpendicular to the longitudinal direction in which the source-drain electrode extends.

Figure 7C:
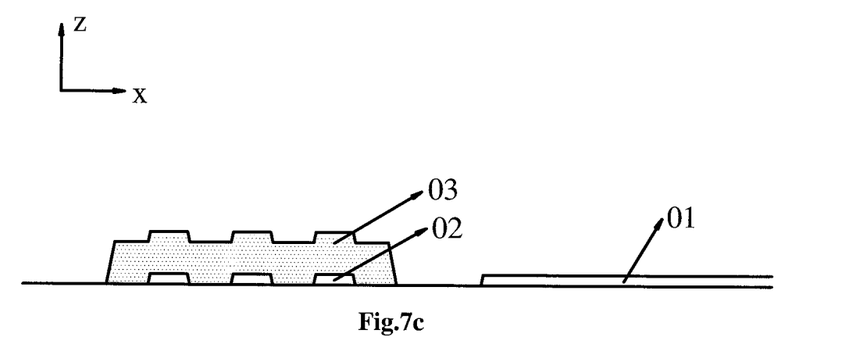
FIG. 7c illustrates a schematic front view of a construction in which a gate electrode is formed.
Figure 7D:
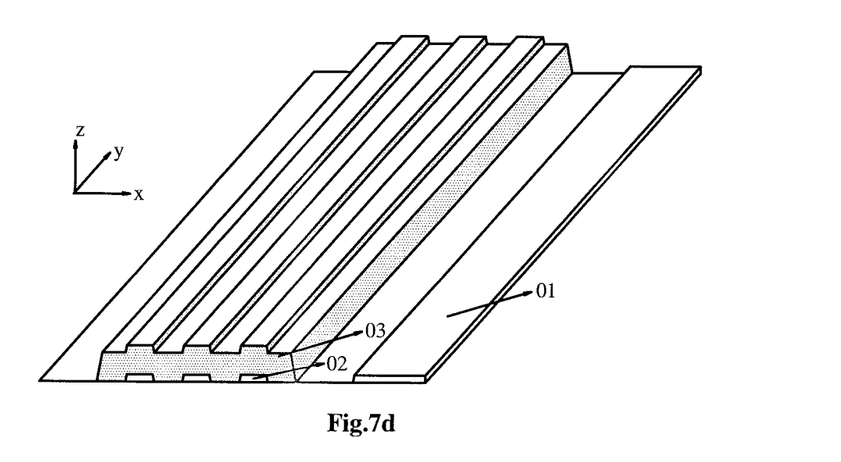
FIG. 7d illustrates a structural schematic view of a three-dimensional construction in which a gate electrode is formed.

In the step S606, as illustrated in FIG. 7c, a metallic material is deposited above all, and the patterned gate electrode 03 which covers the plurality of strip-shaped protrusions 02 are formed by applying a patterning process, such that orthographic projections of the plurality of strip-shaped protrusions 02 on a plane of the substrate fall within a scope of orthographic projections of the gate electrode 03 on the plane of the substrate. The metallic material may for example be, but not limited to, Cu, MoAlMo or Mo. FIG. 7d illustrates a structural schematic view of a three-dimensional construction in which a gate electrode 03 is formed.

Figure 7E:
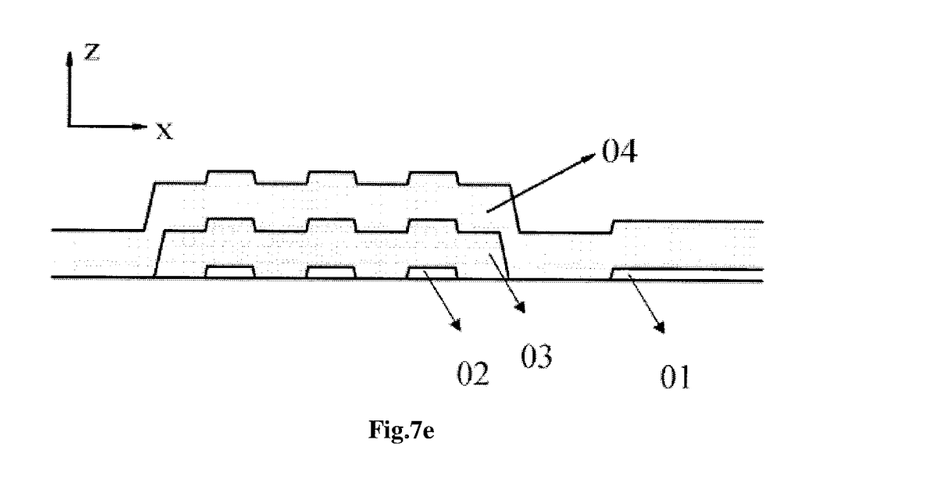
FIG. 7e illustrates a schematic front view of a construction in which a gate insulating layer for the gate electrode is formed.

As illustrated in FIG. 7e, a layer of insulating material is subsequently deposited, and the gate insulating layer 04 which is patterned is formed on the gate electrode, by means of a patterning process. The insulation material for the gate insulating layer may for example be, but not limited to, SiNx, SiOx or SiON.

Figure 7F:
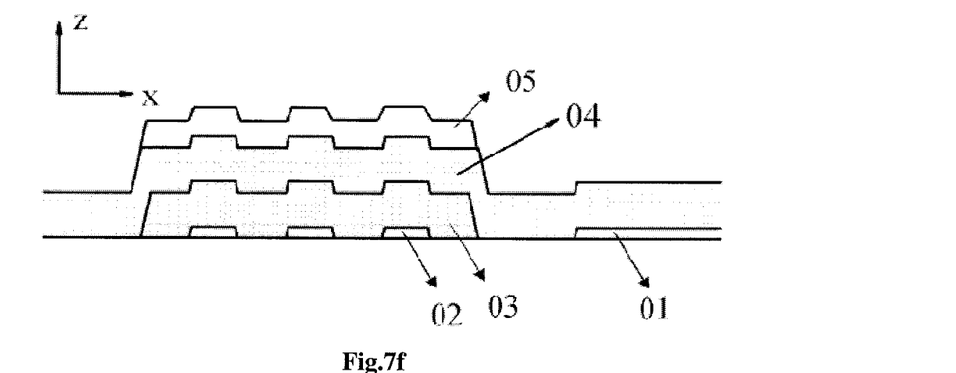
FIG. 7f illustrates a schematic front view of a construction in which an active layer is formed.
Figure 7G:
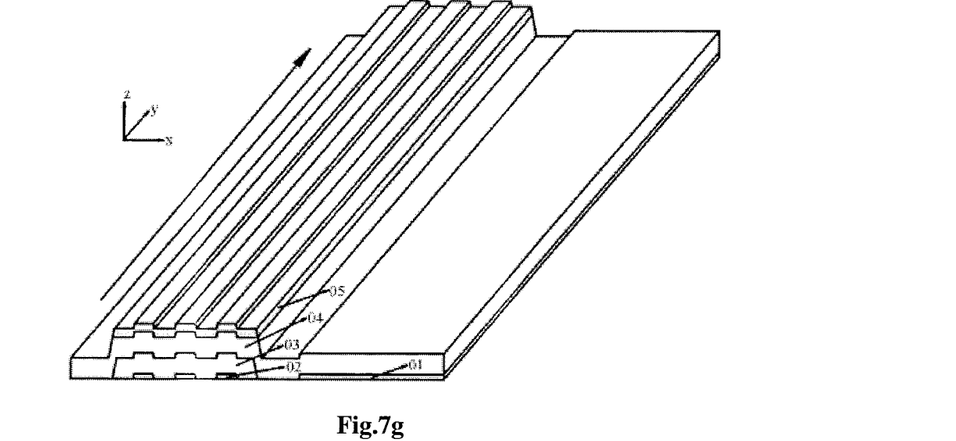
FIG. 7g illustrates a structural schematic view of a three-dimensional construction in which an active layer is formed.

As illustrated in FIG. 7f, a layer of semiconductor material is then deposited, and the active layer 05 which is patterned is formed on the gate insulating layer 04, by means of a pattering process. The semiconductor material may for example be, but not limited to, a-Si, IGZO or p-Si. FIG. 7g illustrates a structural schematic view of a three-dimensional construction in which an active layer 05 is formed.

Figure 7H:
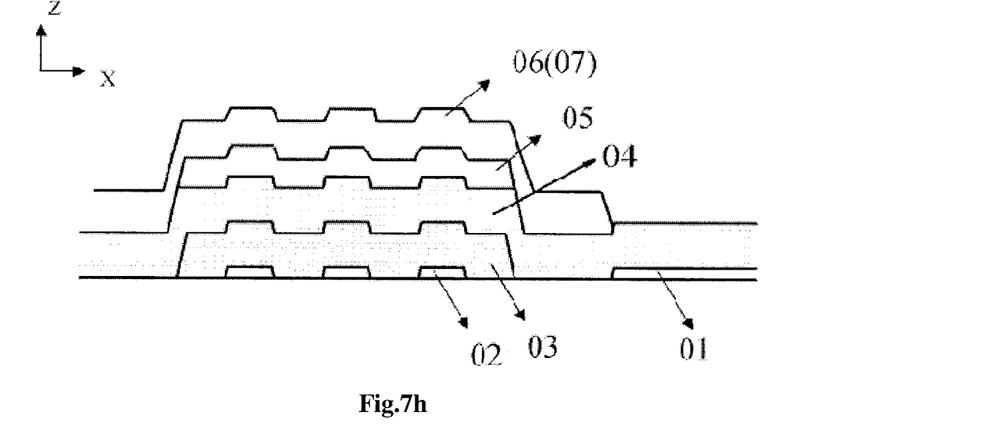
FIG. 7h illustrates a schematic front view of a construction in which a source-drain electrode is formed.

As illustrated in FIG. 7h, both a source 06 and a drain 07 are formed finally on the active layer 05, and the active layer 05 forms channels of the thin film transistor by a plurality of first strip-shaped bulges formed on the active layer 05 which first strip-shaped bulges are aligned with the plurality of strip-shaped protrusions.

A source-drain electrode is formed at both ends, in the second direction, of a surface of the active layer 05 which surface is facing away from the gate insulating layer 04, and channels of the thin film transistor are formed by a plurality of first strip-shaped bulges formed on the active layer 05 which first strip-shaped bulges are aligned with the plurality of strip-shaped protrusions, and portion of the source-drain electrode 06, 07 which are aligned with the plurality of first strip-shaped bulges being also provided with a plurality of second strip-shaped bulges. A lengthwise direction of the channels refers to a direction in which the plurality of protrusions extend, i.e., the second direction, also referred to as a y-axis direction as illustrated; and a widthwise direction thereof refers to a direction which is perpendicular to the lengthwise direction and parallel to the plane of the substrate, i.e., the first direction, also referred to as a x-axis direction as illustrated.

Figure 7I:
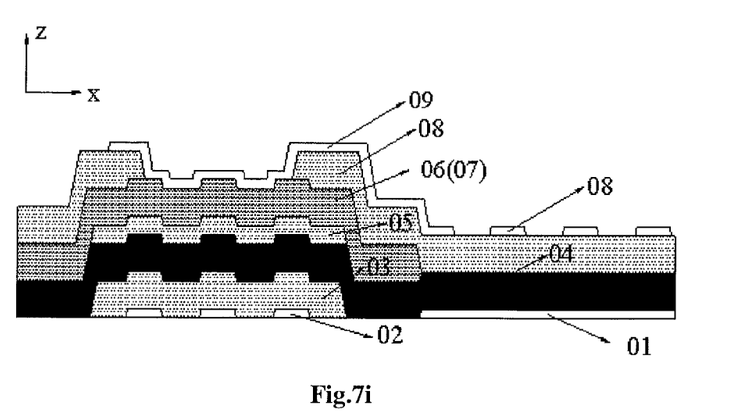
FIG. 7i illustrates a structural schematic view of a three-dimensional construction in which both an insulation layer and a pixel electrode are formed.

Step S608: as illustrated in FIG. 7i, a passivated insulation layer 08 is formed on a region of channels aligned with the source 06, the drain 07 and the active layer 05; and a throughhole is formed on a portion of the passivated insulation layer 08 in alignment with the drain 07, with a pixel electrode 09 being formed within the throughhole.

Therefore, it may be seen that, when an array substrate of an ADS type display device is prepared by the method of the embodiments of the disclosure, a plurality of strip-shaped protrusions and a common electrode may be formed synchronously, which is similar to the method for manufacturing a thin film transistor as above, without any additional process for the plurality of strip-shaped protrusions, and without addition of processes of the patterning. The thin film transistor may be prepared whose channels are essentially aligned with and shaped similar to the plurality of strip-shaped protrusions in the widthwise direction, such that the processes are simplified and the cost is relatively low.

An array substrate which is prepared by above method for preparation is provided in yet another embodiment of the disclosure, as illustrated in FIG. 7i. The array substrate comprises: a substrate;

an electrode 01 which is patterned on the substrate, and a plurality of strip-shaped protrusions 02 which are also formed on the substrate and arranged to be spaced apart from one another in a first direction, the plurality of strip-shaped protrusions extending in a second direction, and the patterned electrode 01 functioning as a common electrode for the ADS type display device which located in a same layer and formed by same material as the plurality of strip-shaped protrusions 02;

a thin film transistor whose gate electrode 03, gate insulating layer 04, active layer 05 and source-drain electrode 06, 07 cover the plurality of strip-shaped protrusions 02 sequentially, wherein the active layer is provided with a plurality of first strip-shaped bulges which are aligned with the plurality of strip-shaped protrusions, and portion of the source-drain electrode the which are aligned with the plurality of first strip-shaped bulges are also provided with a plurality of second strip-shaped bulges, the plurality of strip-shaped bulges being spaced apart from one another in the first direction and extending in the second direction; and wherein the first direction is perpendicular to the second direction which is in turn perpendicular to the longitudinal direction in which the source-drain electrode extends; and an insulation layer 08 formed on the source, the drain and the active layer, the insulation layer being provided with a throughhole in its portion aligned with the drain, and a pixel electrode formed within the throughhole.

By way of example, the plurality of strip-shaped protrusions are formed to be a form of an integral bump, in a lengthwise direction of a channel; or otherwise, by way of example, the plurality of strip-shaped protrusions are formed to be in a form of intermittent bumps by a plurality of separated convex columns, in the lengthwise direction of a channel.

The channels of the thin film transistor on the array substrate, as in the embodiment of the disclosure, may be provided with a concave-convex structure aligned with the plurality of strip-shaped protrusions, in a widthwise direction, e.g., so as to increase a width of the channels of the thin film transistor in case that an area of overall orthographic projection of the thin film transistor on the plane of the substrate remains unchanged, and in turn to enhance the aspect ratio of the thin film transistor effectively, and to increase an on-current thereof but in turn to decrease overall power consumption thereof. And provided that the thin film transistor has an aspect ratio which is maintained equal to that of a conventional thin film transistor, an effective width of the channels of the thin film transistor as in the embodiments of the disclosure increases, so as to decrease a length of the channels and thus to decrease the area of overall orthographic projection of the thin film transistor on the plane of the substrate, and in turn to increase the aperture ratio of the display device.

Furthermore, in the thin film transistors of the array substrate of the embodiment of the disclosure, on each of a surface of the gate insulating layer facing the substrate and a surface of the gate insulating layer facing away from the substrate, there is provided with a concave-convex structure respectively which is aligned with the plurality of strip-shaped protrusions, the gate insulating layer being provided with a uniform thickness, so as to be helpful in keeping a control capability of switching the channels by the gate electrode. Similarly, on each of a surface of the active layer facing the substrate and a surface of the active layer facing away from the substrate, there is also provided with a concave-convex structure respectively which is aligned with the plurality of strip-shaped protrusions, the active layer being provided with a uniform thickness, so as to be beneficial to increase the on current and to improve homogeneity of current.

In still yet another embodiment of the disclosure, there is provided a display device, comprising the array substrate as above. By way of example, the display device comprises a TFT-LCD display device, such as liquid crystal TV set, mobile-phone, E-book and tablet computer, and the like.

So far, embodiments of the disclosure are set forth in detail in view of the drawings. According to above depictions, there may be a clear knowledge by those skilled in the art on the thin film transistor, the method for manufacturing a thin film transistor, the array substrate and the display device.

There are at least one of numerous beneficial technical effects brought about by the technical solutions provided by the thin film transistor, the method for manufacturing a thin film transistor, the array substrate and the display device according to the exemplary embodiments of the disclosure, as follows:

i. The channels of the thin film transistor may be provided with a concave-convex structure aligned with the plurality of strip-shaped protrusions, in a widthwise direction, e.g., so as to enhance the aspect ratio of the thin film transistor in case that an area of overall orthographic projection of the thin film transistor remains unchanged, and in turn to enhance an on-current of the thin film transistor but in turn to decrease overall power consumption thereof. And provided that the thin film transistor has an aspect ratio which is maintained unchanged, a length of the channels decreases and the aperture ratio of the display device is in turn to be increased;

ii. Prior to forming structures of various layers of the thin film transistor, a plurality of strip-shaped protrusions are formed on a substrate by a patterning process, and then a gate electrode, a gate insulating layer, a active layer, and a source-drain electrode are formed sequentially on the plurality of strip-shaped protrusions; in other words, the thin film transistor is prepared, whose channels are aligned with and shaped similarly to the plurality of strip-shaped protrusions, in a widthwise direction thereof. By such a method, no additional process is required to handle the gate electrode, the gate insulating layer, and the active layer dedicatedly, resulting in simple processes thereof and a low cost.

iii. Each of the gate insulating layer and the active layer thus formed are provided with a uniform thickness respectively, which fact is helpful in keeping a control capability of switching the channels by the gate electrode, and is beneficial to increase the on current and to improve homogeneity of current.

iv. When a thin film transistor in an ADS type display device is prepared by the method for preparation in the embodiments of the disclosure, a plurality of strip-shaped protrusions may be formed simultaneously when the common electrode is formed, by just one depositing and patterning process, without any additional process for the plurality of strip-shaped protrusions, and without addition of processes of the patterning, so as to further simplify the processes and to decrease cost.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A method for manufacturing a thin film transistor, comprising:
   forming a plurality of strip-shaped protrusions on a substrate being are arranged to be spaced apart from one another in a first direction, the plurality of strip-shaped protrusions extending in a second direction; and
   forming a gate electrode, a gate insulating layer, an active layer and a source-drain electrode sequentially, on the plurality of strip-shaped protrusions,
   wherein the active layer is provided with a plurality of first strip-shaped bulges which are aligned with the plurality of strip-shaped protrusions, and portion of the source-drain electrode which are aligned with the plurality of first strip-shaped bulges are also provided with a plurality of second strip-shaped bulges, the plurality of first strip-shaped bulges being spaced apart from one another in the first direction and extending in the second direction;
   wherein the first direction is perpendicular to the second direction, and the second direction is further perpendicular to a longitudinal direction in which the source/drain electrode extends;
   wherein each of the plurality of strip-shaped protrusions is shaped to be one of a rectangular shape, a triangular shape, a semi-circular shape, and a semi-elliptical shape, at a cross section thereof perpendicular to a direction in which the plurality of strip-shaped protrusions extend;
   wherein the thin film transistor is a U-channel thin film transistor;
   wherein the plurality of strip-shaped protrusions are not parallel to one another on the substrate, but are spaced apart from one another angularly, and arranged to be in a form of an integral/overall sectorial-shaped arrangement; and
   wherein the plurality of strip-shaped protrusions are formed to be in a form of intermittent bumps formed by a plurality of separated convex columns, in the lengthwise direction of a channel.

2. The method according to claim 1, wherein the forming the plurality of strip-shaped protrusions on a substrate which are arranged to be spaced apart from one another in a first direction comprises:
   depositing an insulation material layer on the substrate; and
   patterning on the insulation material layer, so as to form the plurality of strip-shaped protrusions being arranged to be spaced apart from one another in the first direction.

3. The method according to claim 2, wherein the plurality of strip-shaped protrusions are parallel to one another, and orthographic projections of the gate electrode on a plane of the substrate cover orthographic projections of the plurality of strip-shaped protrusions on the plane of the substrate.

4. The method according to claim 1, wherein the forming the plurality of strip-shaped protrusions on a substrate which are arranged to be spaced apart from one another in a first direction comprises:
   depositing a transparent conductive film on the substrate; and
   patterning on the transparent conductive film, so as to form a common electrode and the plurality of strip-shaped protrusions being arranged to be spaced apart from one another in the first direction.

5. The method according to claim 4, wherein the plurality of strip-shaped protrusions are parallel to one another, and orthographic projections of the gate electrode on a plane of the substrate cover orthographic projections of the plurality of strip-shaped protrusions on the plane of the substrate.

6. The method according to claim 1, wherein the plurality of strip-shaped protrusions are parallel to one another, and orthographic projections of the gate electrode on a plane of the substrate cover orthographic projections of the plurality of strip-shaped protrusions on the plane of the substrate.

7. The method according to claim 6, wherein the plurality of strip-shaped protrusions are formed to be a form of an integral bump, in a lengthwise direction of a channel.

8. The method according to claim 1, wherein either one of the gate electrode, the gate insulating layer and the active layer is formed to be provided with a concave-convex structure which comprises convex portions aligned with the plurality of the strip-shaped protrusions respectively and concave portions aligned with the concave portions among the plurality of the strip-shaped protrusions respectively, the convex portions and the concave portions being arranged alternately.

9. A thin film transistor, comprising:
   a plurality of strip-shaped protrusions formed on a substrate and arranged to be spaced apart from one another in a first direction, the plurality of strip-shaped protrusions extending in a second direction; and
   a gate electrode, a gate insulating layer, an active layer and a source/drain electrode on the plurality of strip-shaped protrusions sequentially,
   wherein the active layer is provided with a plurality of first strip-shaped bulges which are aligned with the plurality of strip-shaped protrusions, and portion of the source-drain electrode which are aligned with the plurality of first strip-shaped bulge are also provided with a plurality of second strip-shaped bulges, the plurality of first strip-shaped bulges being spaced apart from one another in the first direction and extending in the second direction;
   wherein the first direction is perpendicular to the second direction, the second direction is further perpendicular to a longitudinal direction in which the source-drain electrode extends;
   wherein each of the plurality of strip-shaped protrusions is shaped to be one of a rectangular shape, a triangular shape, a semi-circular shape, and a semi-elliptical shape, at a cross section thereof perpendicular to a direction in which the plurality of strip-shaped protrusions extend;
   wherein the thin film transistor is a U-channel thin film transistor;

wherein the plurality of strip-shaped protrusions are not parallel to one another on the substrate, but are spaced apart from one another angularly, and arranged to be in a form of an integral/overall sectorial-shaped arrangement; and wherein the plurality of strip-shaped protrusions are formed to be in a form of intermittent bumps formed by a plurality of separated convex columns, in the lengthwise direction of a channel.

10. The thin film transistor according to claim 9, wherein the plurality of strip-shaped protrusions are parallel to one another, and orthographic projections of the gate electrode on the plane of the substrate cover orthographic projections of the plurality of strip-shaped protrusions on a plane of the substrate.

11. The thin film transistor according to claim 10, wherein the plurality of strip-shaped protrusions are provided with a form of an integral bump, in a lengthwise direction of a channel.

12. The thin film transistor according to claim 10 wherein on each of a surface of the active layer facing the substrate and a surface of the active layer facing away from the substrate, there is provided with a concave-convex structure respectively which is aligned with the plurality of strip-shaped protrusions, the active layer being provided with a uniform thickness.

13. The thin film transistor according to claim 9, wherein on each of a surface of the active layer facing the substrate and a surface of the active layer facing away from the substrate, there is provided with a concave-convex structure respectively which is aligned with the plurality of strip-shaped protrusions, the active layer being provided with a uniform thickness.

14. The thin film transistor according to claim 13, wherein on each of a surface of the gate insulating layer facing the substrate and a surface of the gate insulating layer facing away from the substrate, there is provided with a concave-convex structure respectively which is aligned with the plurality of strip-shaped protrusions, the gate insulating layer being provided with a uniform thickness.

15. An array substrate, comprising the thin film transistor according to claim 9.

16. A display device, comprising the display panel according to claim 15.

* * * * *